United States Patent
Chang et al.

(10) Patent No.: US 11,532,740 B2
(45) Date of Patent: *Dec. 20, 2022

(54) SEMICONDUCTOR STRUCTURE, HEMT STRUCTURE AND METHOD OF FORMING THE SAME

(71) Applicant: TAIWAN SEMICONDUCTOR MANUFACTURING COMPANY LTD., Hsinchu (TW)

(72) Inventors: Yao-Chung Chang, Hsinchu County (TW); Po-Chih Chen, Hsinchu (TW); Jiun-Lei Jerry Yu, Hsinchu County (TW); Chun Lin Tsai, Hsin-Chu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 14 days.

This patent is subject to a terminal disclaimer.

(21) Appl. No.: 17/207,067

(22) Filed: Mar. 19, 2021

(65) Prior Publication Data
US 2021/0226047 A1    Jul. 22, 2021

Related U.S. Application Data

(60) Continuation of application No. 16/390,543, filed on Apr. 22, 2019, now Pat. No. 10,964,804, which is a
(Continued)

(51) Int. Cl.
*H01L 29/778* (2006.01)
*H01L 29/20* (2006.01)
(Continued)

(52) U.S. Cl.
CPC ...... *H01L 29/7786* (2013.01); *H01L 21/3245* (2013.01); *H01L 29/201* (2013.01);
(Continued)

(58) Field of Classification Search
CPC ............ H01L 29/7786; H01L 29/2003; H01L 21/3245

See application file for complete search history.

(56) References Cited

U.S. PATENT DOCUMENTS

| 6,518,082 B1 | 2/2003 | Kidoguchi et al. |
| 8,975,641 B1 * | 3/2015 | Chiang ............... H01L 29/1075 257/192 |

(Continued)

FOREIGN PATENT DOCUMENTS

| CN | 101877360 A | 11/2010 |
| CN | 102623490 A | 8/2012 |
| CN | 103311284 A | 9/2013 |

OTHER PUBLICATIONS

Office Action, Cited Reference and Search Report dated Jul. 5, 2021 issued by the China National Intellectual Property Administration for the Chinese Counterpart Application No. 201710407585.2.

(Continued)

*Primary Examiner* — Changhyun Yi
(74) *Attorney, Agent, or Firm* — WPAT Law; Anthony King

(57) ABSTRACT

A semiconductor structure includes: a channel layer; an active layer over the channel layer, wherein the active layer is configured to form a two-dimensional electron gas (2DEG) to be formed in the channel layer along an interface between the channel layer and the active layer; a gate electrode over a top surface of the active layer; and a source/drain electrode over the top surface of the active layer; wherein the active layer includes a first layer and a second layer sequentially disposed therein from the top surface to a bottom surface of the active layer, and the first layer possesses a higher aluminum (Al) atom concentration
(Continued)

compared to the second layer. An HEMT structure and an associated method are also disclosed.

20 Claims, 16 Drawing Sheets

Related U.S. Application Data continuation of application No. 15/796,377, filed on Oct. 27, 2017, now Pat. No. 10,269,949, which is a division of application No. 15/172,775, filed on Jun. 3, 2016, now Pat. No. 9,812,562.

(51) Int. Cl.
    *H01L 21/324*     (2006.01)
    *H01L 29/66*     (2006.01)
    *H01L 29/201*     (2006.01)
    *H01L 29/51*     (2006.01)

(52) U.S. Cl.
    CPC .... *H01L 29/2003* (2013.01); *H01L 29/66431* (2013.01); *H01L 29/66439* (2013.01); *H01L 29/66462* (2013.01); *H01L 29/66469* (2013.01); *H01L 29/66522* (2013.01); *H01L 29/778* (2013.01); *H01L 29/7781* (2013.01); *H01L 29/7782* (2013.01); *H01L 29/7783* (2013.01); *H01L 29/7787* (2013.01); *H01L 29/51* (2013.01); *H01L 29/517* (2013.01); *H01L 29/518* (2013.01)

(56) References Cited

U.S. PATENT DOCUMENTS

| | | | |
|---|---|---|---|
| 9,812,562 B1* | 11/2017 | Chang | ................ H01L 29/7786 |
| 2004/0061129 A1* | 4/2004 | Saxler | ............... H01L 29/66462 |
| | | | 257/280 |
| 2012/0320642 A1 | 12/2012 | Imanishi | |
| 2015/0053990 A1 | 2/2015 | Chiang et al. | |

OTHER PUBLICATIONS

Office Action and Search Report dated Feb. 22, 2022 issued by the China National Intellectual Property Administration for the Chinese Counterpart Application No. 201710407585.2.

\* cited by examiner

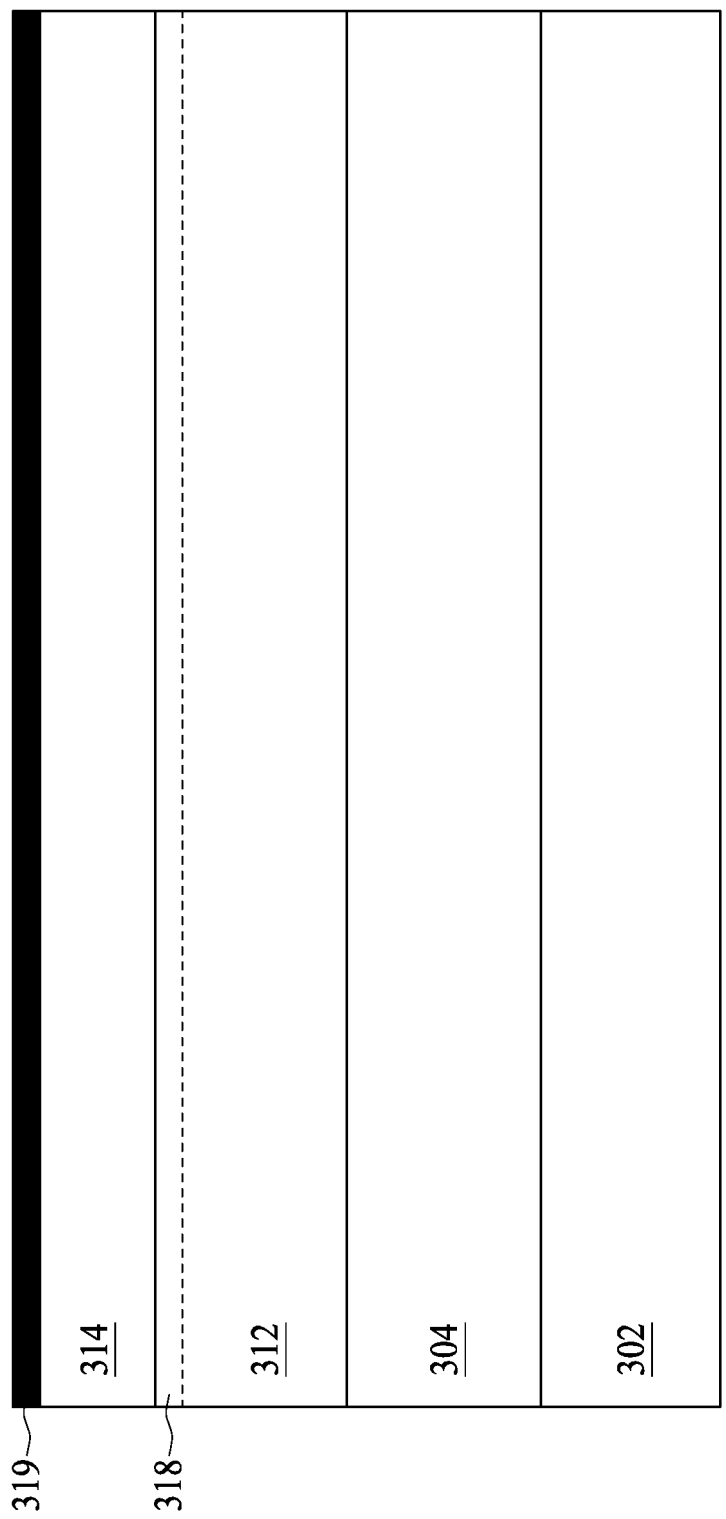

SEMICONDUCTOR STRUCTURE, HEMT STRUCTURE AND METHOD OF FORMING THE SAME

CROSS-REFERENCE TO RELATED APPLICATIONS

This application is a continuation of U.S. application Ser. No. 16/390,543, filed on Apr. 22, 2019, which is a continuation of U.S. application Ser. No. 15/796,377, filed on Oct. 27, 2017, which is a division of U.S. application Ser. No. 15/172,775, filed on Jun. 3, 2016. All of the above-referenced applications are hereby incorporated herein by reference in their entirety.

BACKGROUND

Due to high current density, high breakdown voltage, and low ON resistance, High Electron Mobility Transistors (HEMTs) are suitable for use in power applications. An HEMT structure includes a channel layer and an active layer. A two-dimensional electron gas (2DEG) is generated in the channel layer, adjacent to an interface with the active layer. The 2DEG is used in the HEMT structure as a charge carrier. An issue of the HEMT structure is charge trapping at the drain side of the gate, which can result in a phenomenon known as "current collapse" under high-voltage operation. As such, what is needed is a device with a low on-resistance, as well as low current collapse and improved interface trap density and linear drain current degradation. The embodiments of the present disclosure at least answer these needs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
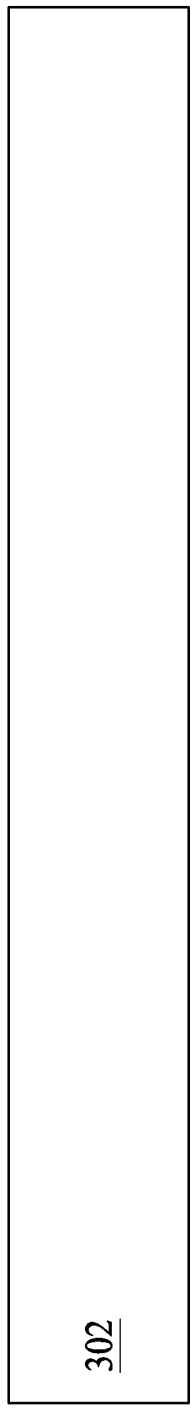
FIGS. 1-8(b) are cross-sectional views of a III-V HEMT structure fabricated at various stages, in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure is directed to a III-V high electron mobility transistor (HEMT) and method for manufacturing the same. Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

III-V HEMTs on silicon substrates are used as power switching transistors for voltage converter applications. Compared to silicon power transistors, III-V HEMTs feature low on-state resistances and low switching losses due to wide bandgap properties. In the present disclosure, a "group III-V semiconductor" refers to a compound semiconductor that includes at least one group III element and at least one group V element, such as, but not limited to, gallium nitride (GaN), aluminum gallium nitride (AlGaN), gallium arsenide (GaAs), indium aluminum gallium nitride (InAlGaN), indium gallium nitride (InGaN) and the like. In a similar manner, a "III-nitride semiconductor" refers to a compound semiconductor that includes nitrogen and at least one group III element, such as, but not limited to, GaN, AGaN, Indium nitride (InN), aluminum nitride (AlN), Indium gallium nitride (InGaN), Indium aluminum gallium nitride (InAlGaN) and the like.

FIGS. 1 to 8(b) are cross-sectional views of a III-V HEMT structure fabricated at various stages, in accordance with some embodiments of the present disclosure. FIG. 1 is a cross-sectional view of the III-V HEMT at an initial fabrication stage, according to one embodiment of the present disclosure. A semiconductor substrate 302 suitable for use as a support substrate for the III-V HEMT is provided. The semiconductor substrate 302 includes a plurality of layers. In some embodiment, the semiconductor substrate 302 includes a bulk substrate on which a plurality of semiconductor layers is formed. The semiconductor substrate 302 is comprised of any material suitable for use as a substrate for fabrication of a group III-V semiconductor device. In some embodiments, the semiconductor substrate 302 includes silicon (Si), silicon carbide (SiC), sapphire, and the like. Alternatively, in some embodiments, the semiconductor substrate 302 is comprised of a native substrate for the materials from which the group III-V semiconductor device is to be fabricated, and may be a native GaN or other III-nitride substrate, for instance. Moreover, although the semiconductor substrate 302 is shown as a substantially unitary substrate, in other embodiments, the semiconductor substrate 302 is corresponding to a semiconductor on insulator substrate, such as a silicon on insulator (SOI) or germanium on insulator (GOI) substrate.

Figure 2:
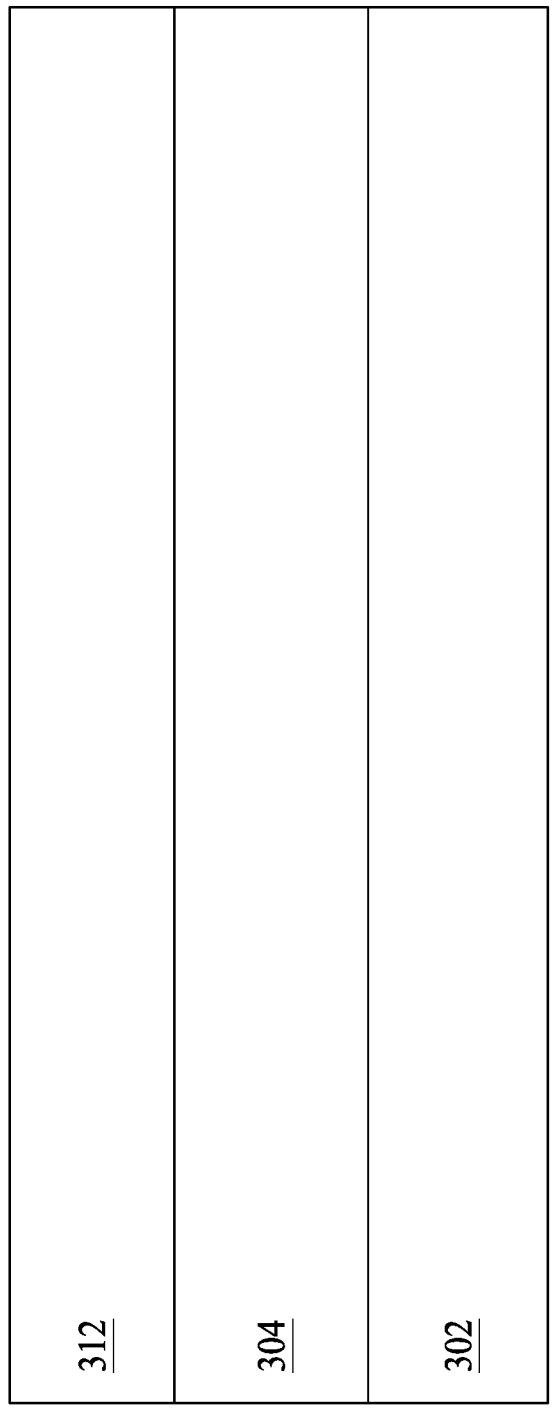

In FIG. 2, a transition structure 304 and a channel layer 312 are successively formed over the semiconductor substrate 302. In some embodiments, the transition structure 304 is comprised of a plurality of layers mediating the lattice transition from the semiconductor substrate 302 to the channel layer 312. In this way, lattice mismatches between the semiconductor substrate 302 and the channel layer 312 can be reduced.

In some embodiments, the transition structure 304 includes a nucleation layer over the semiconductor substrate 302. The nucleation layer has a lattice structure and/or a thermal expansion coefficient (TEC) suitable for bridging the lattice mismatch and/or the TEC mismatch between the semiconductor substrate 302 and an overlying layer, such as a GaN layer described herein. In some embodiments, the nucleation layer includes aluminum nitride (AlN). In some embodiments, the nucleation layer has a thickness of 70 to 300 nanometers (nm). In some embodiments, the nucleation layer is omitted.

The transition structure 304 further includes a transition layer over the nucleation layer in one or more embodiments. The transition layer further facilitates gradual changes of lattice structures and TECs between the nucleation layer (or the semiconductor substrate 302) and the channel layer 312. In some embodiments, the transition layer includes a graded aluminum-gallium nitride ($Al_xGa_{(1-x)}N$, x is the aluminum content ratio in the aluminum-gallium constituent, $0<x<1$) layer. In some embodiments, the graded aluminum gallium nitride layer includes multiple layers each having a decreased ratio x, from a bottom layer adjacent to the semiconductor substrate 302 to the channel layer 312. In at least one embodiment, the graded aluminum gallium nitride layer has three layers having the x ratio in the range of about 0.7-0.9 for the bottom layer, in the range of about 0.4-0.6 for a middle layer, and in the range of about 0.15-0.3 for the top layer. In some embodiments, instead of having multiple layers with different x ratios, the graded aluminum gallium nitride layer has a continuous gradient of the ratio x. In some embodiments, the transition layer has a thickness of about 500 to 1050 nm. In some embodiments, the transition layer is omitted.

In some embodiments, the channel layer 312 includes one or more Group III-V compound layers. Examples of Group III-V compound layers include, but are not limited to, GaN, AlGaN, InGaN and InAlGaN. One or more of the Group III-V compound layers is doped in at least one embodiment. In one or more embodiments, the channel layer 312 includes alternatingly arranged p-doped and n-doped Group III-V compound layers. In at least one embodiment, the channel layer 312 includes a p-doped GaN layer. Examples of the p-type dopant in the p-doped GaN layer include, but are not limited to, C, Fe, Mg and Zn. In one embodiment, the channel layer 312 has a thickness of about 100 to about 200 nm.

The channel layer 312 may be formed over the semiconductor substrate 302 using a number of existing growth techniques. In some embodiments, the channel layer 312 may be formed over the transition structure 304 using molecular-beam epitaxy (MBE), metalorganic chemical vapor deposition (MOCVD), hydride vapor phase epitaxy (HVPE), or other suitable approaches.

Figure 3:
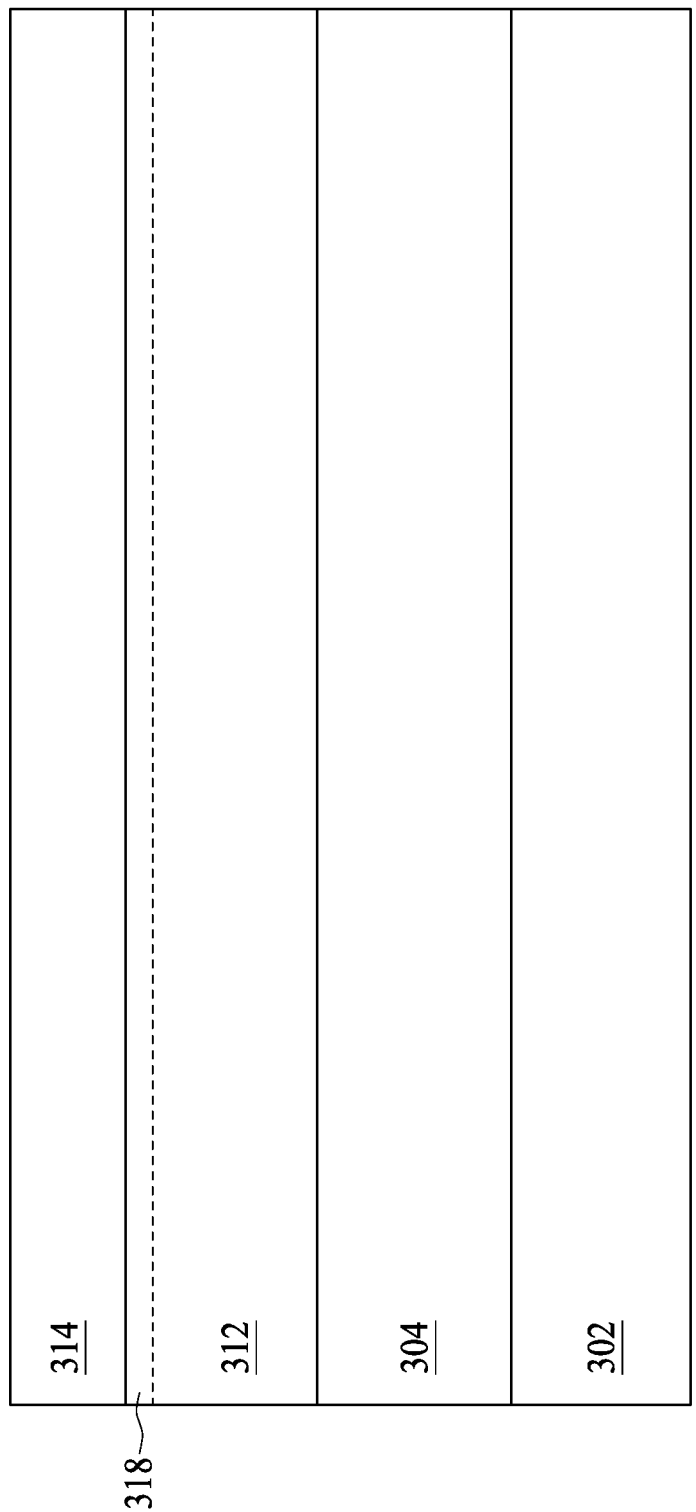

In FIG. 3, an active layer 314 is formed over the channel layer 312. The active layer 314 includes one or more Group III-V compound layers which are different from the Group III-V compound layers of the channel layer 312 in composition. In some embodiments, the active layer 314 includes AlN, $Al_yGa_{(1-y)}N$ (where y is the aluminum content ratio, $0<y<1$), or a combination thereof. The active layer 314 is configured to give rise to a two dimensional electron gas (2DEG) 318 in the channel layer 312 along the interface between the channel layer 312 and the active layer 314. A heterojunction is formed between the active layer 314 and the channel layer 312 having two different semiconductor materials. A band gap discontinuity exists between the active layer 314 and the channel layer 312. Due to piezoelectric effects, electrons in the active layer 314 may drop into the channel layer 312, and thus create a thin layer of highly mobile conducting electrons, i.e., the 2DEG 318, in the channel layer 312, adjacent to the interface with the active layer 314. The electrons in the 2DEG 318 are charge carriers in the channel layer 312.

Figure 4:
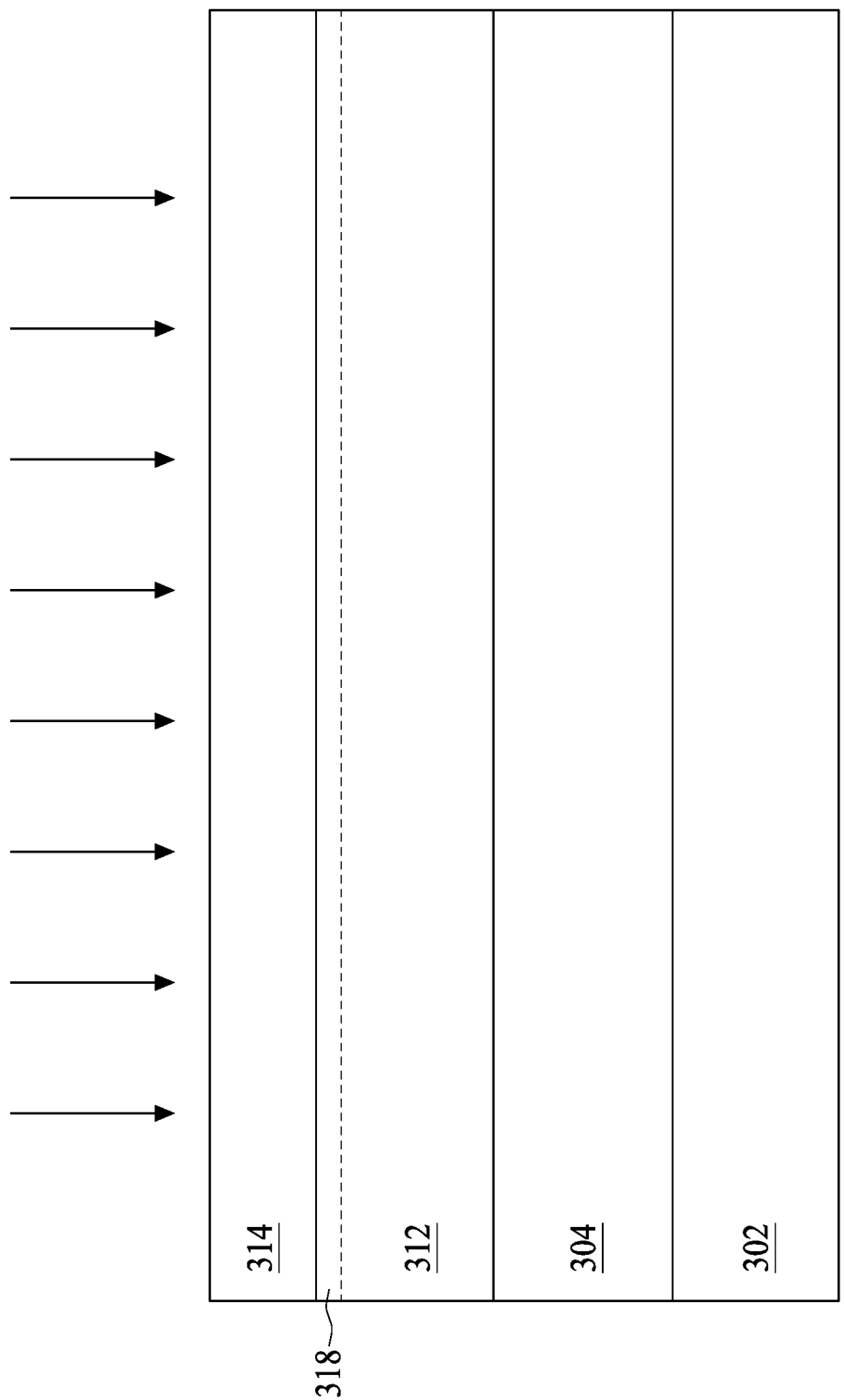

During the fabrication process, the surface of the active layer 314 may be gradually oxidized, resulting in the formation of (native) oxides over the exposed surface thereof. The oxides include aluminum oxide (AlO), gallium oxide (GaO), nitride oxide (NO), or combinations of Al, Ga, N, and O. In this embodiment, a cleaning step and/or an annealing is performed upon the surface of the active layer 314, as shown in FIG. 4, before moving to a subsequent stage. The cleaning step can remove contaminants on the surface of the active layer 314. The cleaning step can also remove oxides or reduce the amount of oxides absorbed on the surface of the active layer 314. In this embodiment, a wet cleaning step is performed by exposing the surface of the active layer 314 to any suitable wet cleaning solution.

In the exemplary embodiment, a nitrogen-based ambient atmosphere is supplied to the surface of the active layer 314 during the annealing process. The annealing is employed to reduce resistance of the active layer 314 by fixing defects attributed to the presence of high densities of donor-type point defects, such as nitrogen vacancies ($V_N$), Ga/N antisites, and their complexes with native defects and acceptor dopants, which have relatively low formation energies. These defects are known to have a donor behavior in GaN, thus restricting the maximum p-type conduction. The achievement of high p-type conductivity is even more difficult in ion-implanted GaN layers because the implantation-induced damage creates extra donor-type defects, which compensate the activated holes. The introduced defects have mainly deep levels within the bandgap; therefore, the as-implanted GaN is electrically highly resistive. The damage must be annealed out to achieve electrical activation of the implanted dopants. In some embodiments, the annealing is achieved in the temperature range of about 350° C. to about 800° C.

In FIG. 5(a), a thin AlN film 319 is blanket deposited over the cleaned and annealed surface of the active layer 314. A concentration of Al in the AlN film 319 is higher than a concentration of Al in the active layer 314. In some embodiments, a ratio of the concentration of Al in the AlN film 319 to the concentration of Al in the active layer 314 is from about 1.1 to 2.5. In some embodiments, an atomic layer deposition (ALD) may be employed for blanket depositing the thin AlN film 319 over the active layer 314. However, this is not a limitation of the present disclosure. In other embodiments, the thin AlN film 319 may be formed over the active layer 314 using MBE, chemical vapor deposition (CVD), sputtering, electron beam evaporation (E-beam evaporation), thermal evaporation, or other suitable approaches. The AlN film 319 is deposited to a thickness that is adequate to provide a required concentration of Al to the adjacent active layer 314. In some embodiments, the AlN film 319 is deposited to a thickness of about the length of 3 to 20 Al atoms.

Figure 5B:
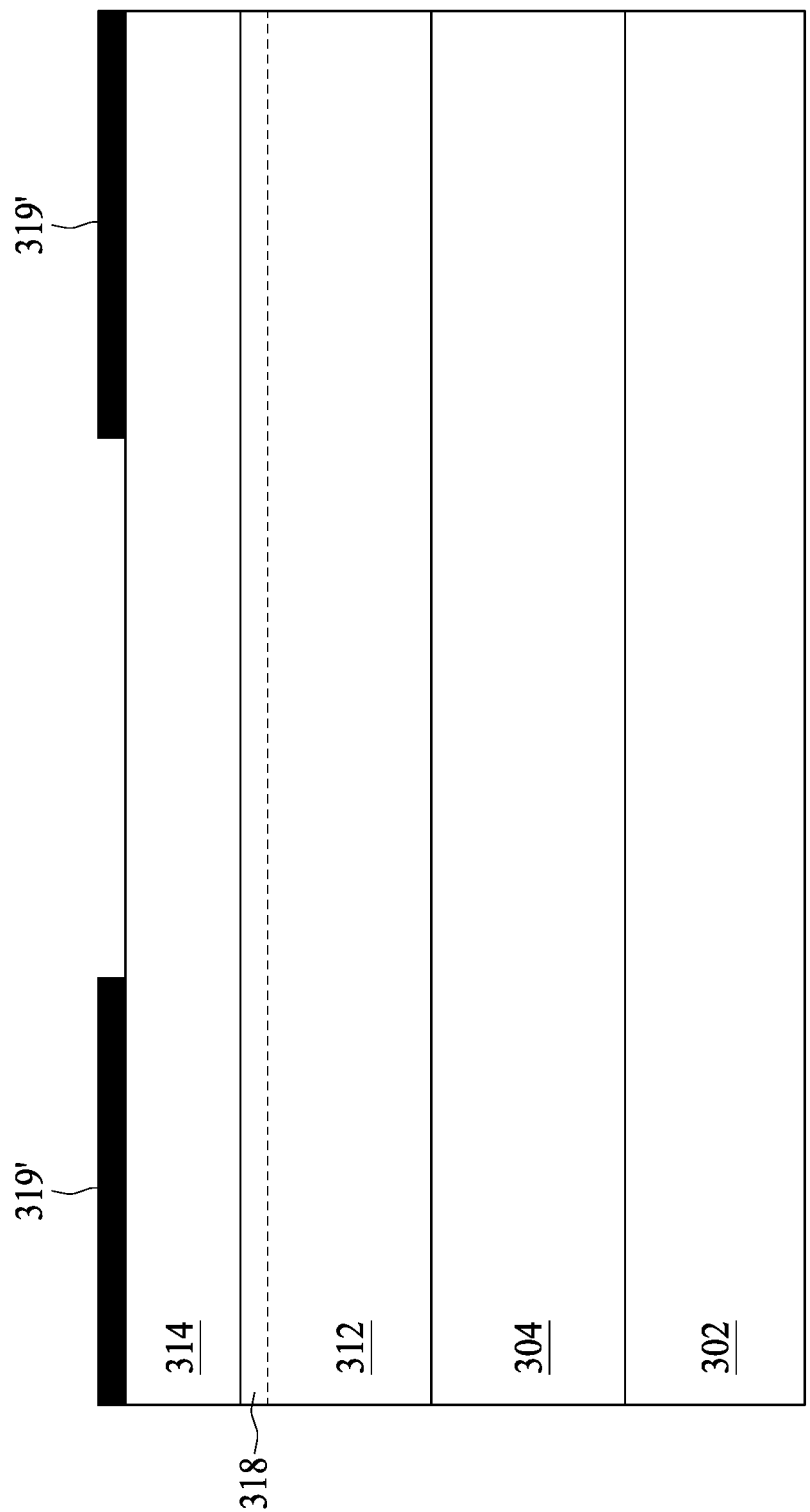

In some other embodiments, a thin AlN film 319' is deposited over a portion of the cleaned and annealed surface of the active layer 314 as shown in FIG. 5(b). In particular, the deposition of the thin AlN film 319' over the actively layer 314 may be selectively performed to avoid the portion of the active layer 314 surface that is reserved for a gate electrode. A concentration of Al in the AlN film 319' is higher than a concentration of Al in the active layer 314. In some embodiments, a ratio of the concentration of Al in the AlN film 319' to the concentration of Al in the active layer 314 is from about 1.1 to 2.5. Since a high voltage and high temperature around the gate electrode may accelerate the breaking of the bond between the high Al concentration layer and the adjacent active layer 314, the partial deposition of the thin film 319' may contribute to higher reliability in the manufactured device. A thickness requirement of the thin AlN film 319' may be substantially the same as the AlN film 319. In some embodiments, the AlN film 319' is deposited to a thickness of about the length of 3 to 20 Al atoms. The thin AlN film 319' may be formed over the active layer 314 using MBE, CVD, sputtering, E-beam evaporation, thermal evaporation, or other suitable approaches.

Figure 6A:
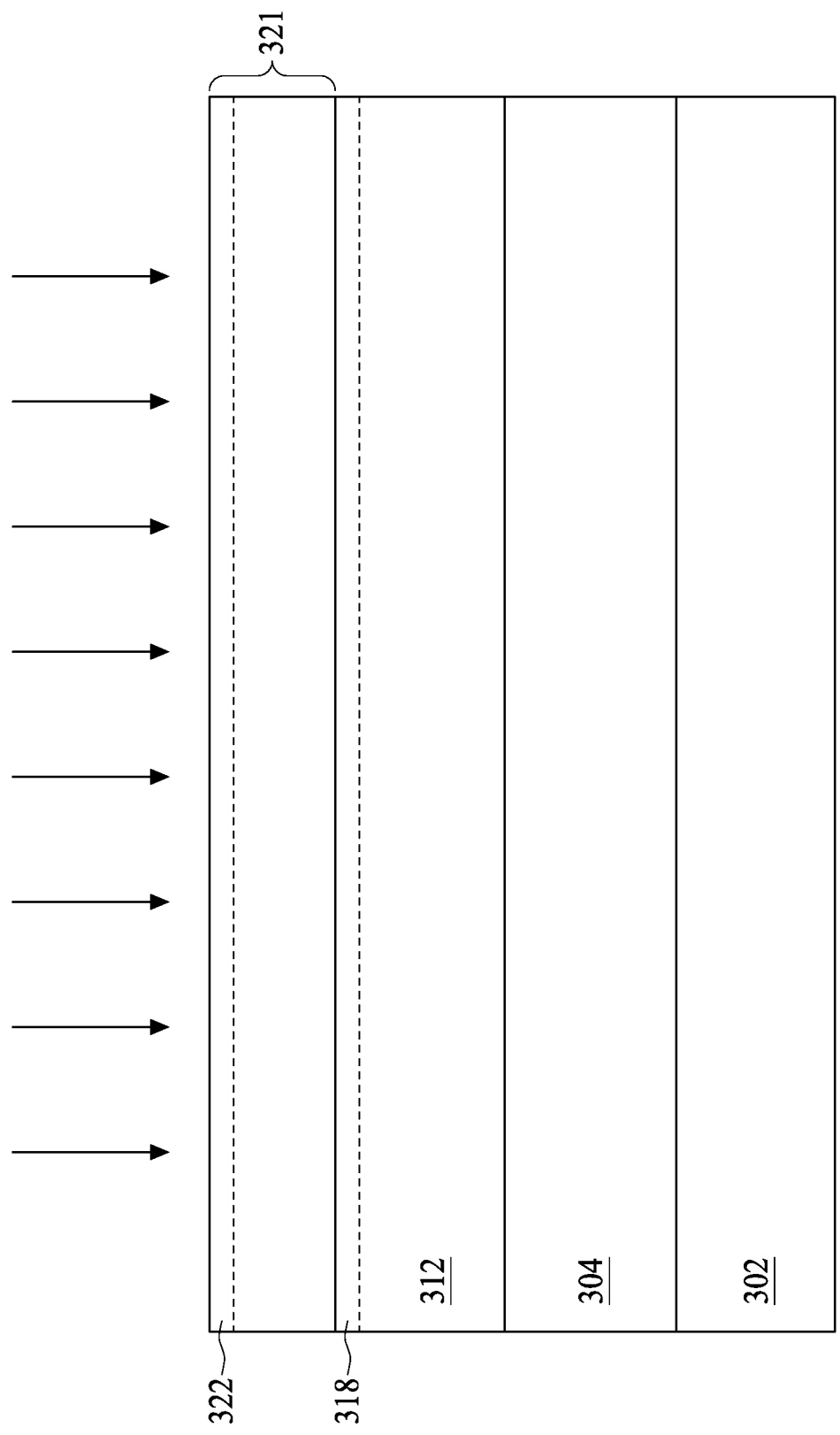

In FIG. 6(a), a high temperature annealing is performed upon the semiconductor structure of FIG. 5(a). During the annealing, Al atoms from the high concentration region (e.g., in the thin AlN film 319) gradually diffuse into and react with the adjacent active layer 314. After the annealing, the Al film 319 and the active layer 314 cooperatively form an extra Al diffused active layer 321, in which an Al concentration gradually decreasing from a surface/boundary of the extra Al diffused active layer 321 toward the inside thereof. In some embodiments, the annealing is achieved in the temperature range of about 500° C. to about 900° C.

In some embodiments, the extra diffusion of Al extends to a depth of less than about 5 nm from a surface of the extra Al diffused active layer 321 toward the inside thereof and forms a high diffusion layer of Al (e.g., a high diffusion AL layer 322) as shown in FIG. 6(a). As such, most portions of the extra Al diffused active layer 321 under the high Al diffusion layer 322 still possess an Al concentration substantially the same as the active layer 314 before the high temperature annealing. The high Al diffusion layer 322 naturally presents a high band barrier at an interface between the active layer 314 and a dielectric layer of a gate electrode being formed thereon in the following steps. In this way, the high Al diffusion layer 322 can reduce the chance of electrons being trapped in the defects of lattice mismatch at the interface. Therefore, some characteristics related to interface trap density (Dit), such as linear drain current (Idlin) degradation, current collapse, and the dynamic on-state resistance $R_{ON}$, can be dramatically improved.

Figure 6B:
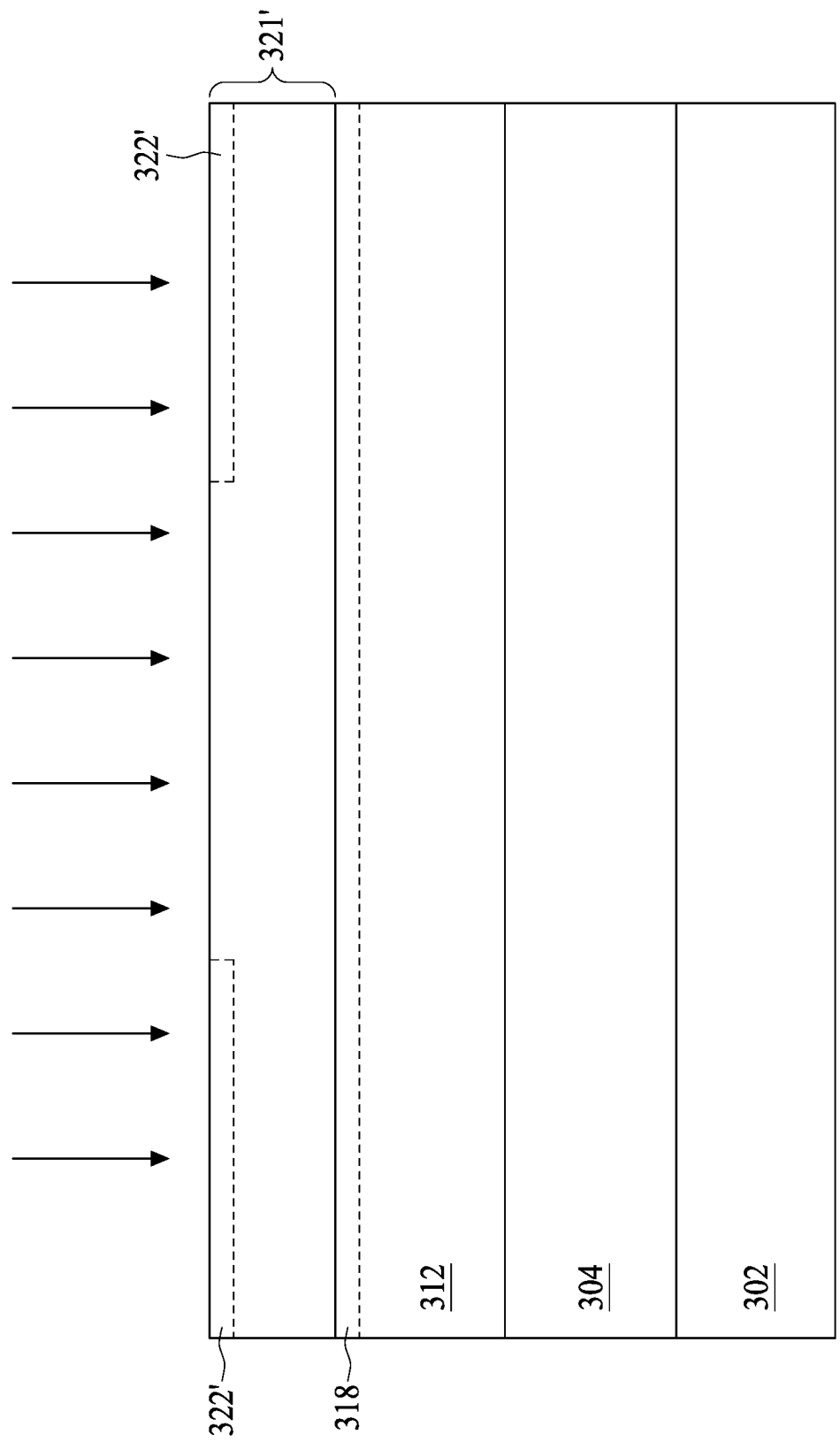

In FIG. 6(b), a high temperature annealing similar to FIG. 6(a) is performed upon the semiconductor structure of FIG. 5(b). During the annealing, Al atoms from the higher concentration region (e.g., in the thin AlN film 319') gradually diffuse into and react with the adjacent active layer 314. After the annealing, the Al film 319' and the active layer 314 cooperatively form an extra Al diffused active layer 321', in which an Al concentration gradually decreasing from a surface/boundary of the extra Al diffused active layer 321' toward the inside thereof. In some embodiments, the annealing is achieved in the temperature range of about 500° C. to about 900° C.

In some embodiments, extra diffusion of Al extends to a depth of less than about 5 nm from a surface of the extra Al diffused active layer 321' toward the inside thereof and forms a high Al diffusion layer 322' as shown in FIG. 6(b). As such, most portions of the extra Al diffused active layer 321' outside the high Al diffusion layer 322' still possess an Al concentration substantially the same as the active layer 314 before the high temperature annealing. The high Al diffusion layer 322' can also improve some characteristics, such as the interface trap density, Idlin degradation, current collapse, and the dynamic on-state resistance $R_{ON}$.

Figure 9:
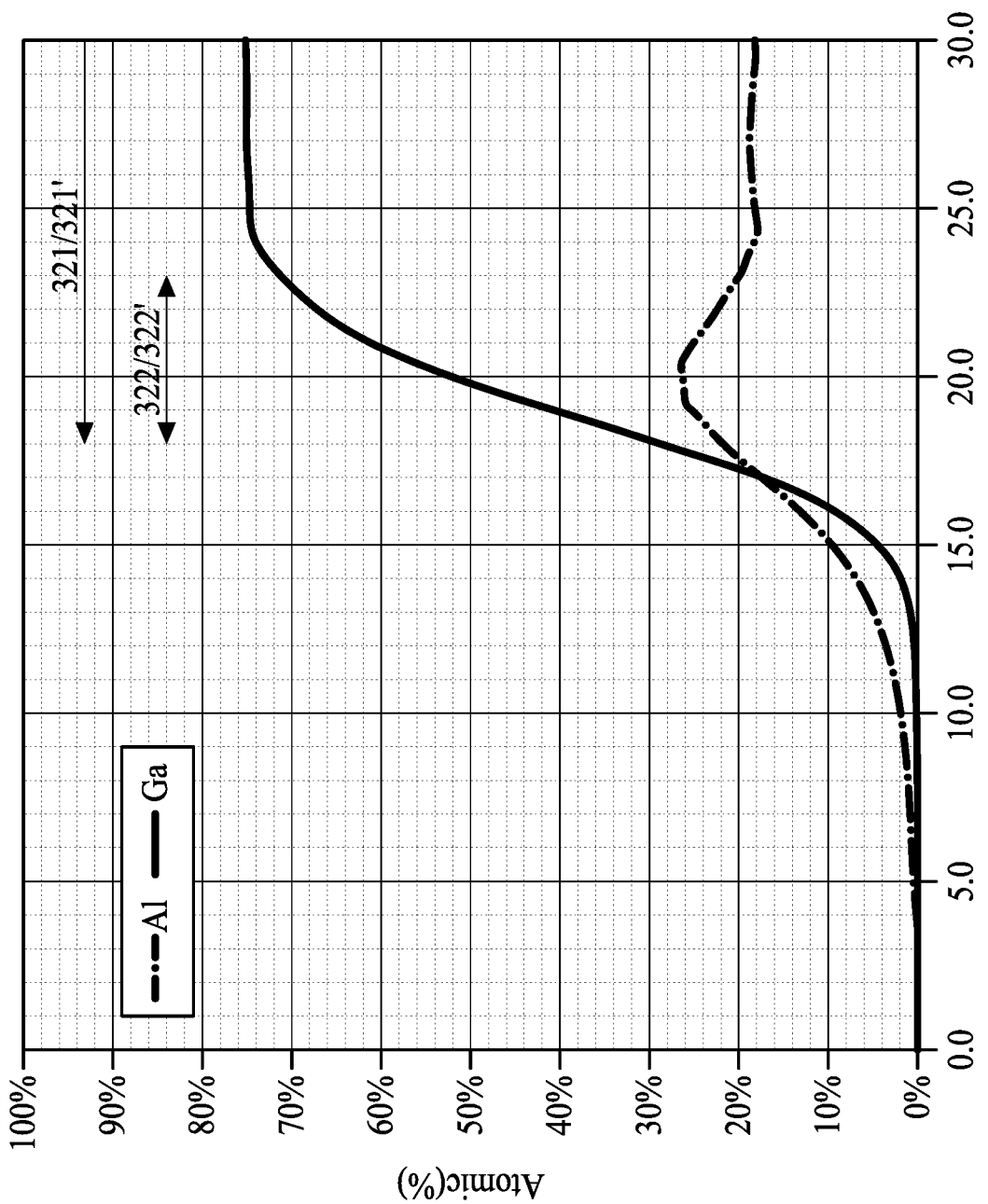
FIG. 9 is a graph illustrating an energy dispersive X-ray (EDX) analysis of Ga atoms and Al atoms in accordance with some embodiments of the present disclosure.

Before discussing the following formation process of the III-V HEMT structure, please refer to FIG. 9. FIG. 9 is a graph illustrating an energy dispersive X-ray (EDX) analysis of Ga atoms and Al atoms in accordance with some embodiments of the present disclosure. In the EDX analysis, the extra Al diffused active layer 321 is located under a depth of about 18 nm, and the region of the high Al diffusion layer 322 or the high Al diffusion layer 322' is located at a depth from about 18 nm to about 24 nm. The EDX analysis indicates that the primary peak for Al atoms is located in the high Al diffusion layer 322/322'. A flat curve for Al atoms, which is located deeper than a depth of about 24 nm, has an Al concentration substantially the same as that of the active layer 314 before the high temperature annealing. In this embodiments, the primary peak for Al atoms amounts to about 26 atomic %, and the flat curve for Al atoms in the extra Al diffused active layer 321/321' amounts to about 18 atomic %. In some embodiments, a ratio of the concentration of Al at the primary peak to the concentration of Al at the flat curve is from about 1.1 to 2.5. In addition, the concentration of Al at the primary peak is lower than a concentration of Ga at the same depth. In some embodiments, similar results may be obtained by X-ray photoelectron spectroscopy (XPS) analysis or any other suitable means.

Referring back to FIG. 7(a), a gate structure 362 includes a conductive gate electrode 364 formed over a gate dielectric 320. The conductive gate electrode 364 may be comprised of any suitable conductive material, such as doped polysilicon, for example, or a metal such as titanium (Ti) or aluminum (Al). The gate dielectric 320 may be comprised of aluminum oxide (Al2O3), silicon dioxide (SiO2) or silicon nitride (Si3N4), for example. The gate electrode 364 forms a non-ohmic contact to the surface of the high Al diffusion layer 322.

Figure 7A:
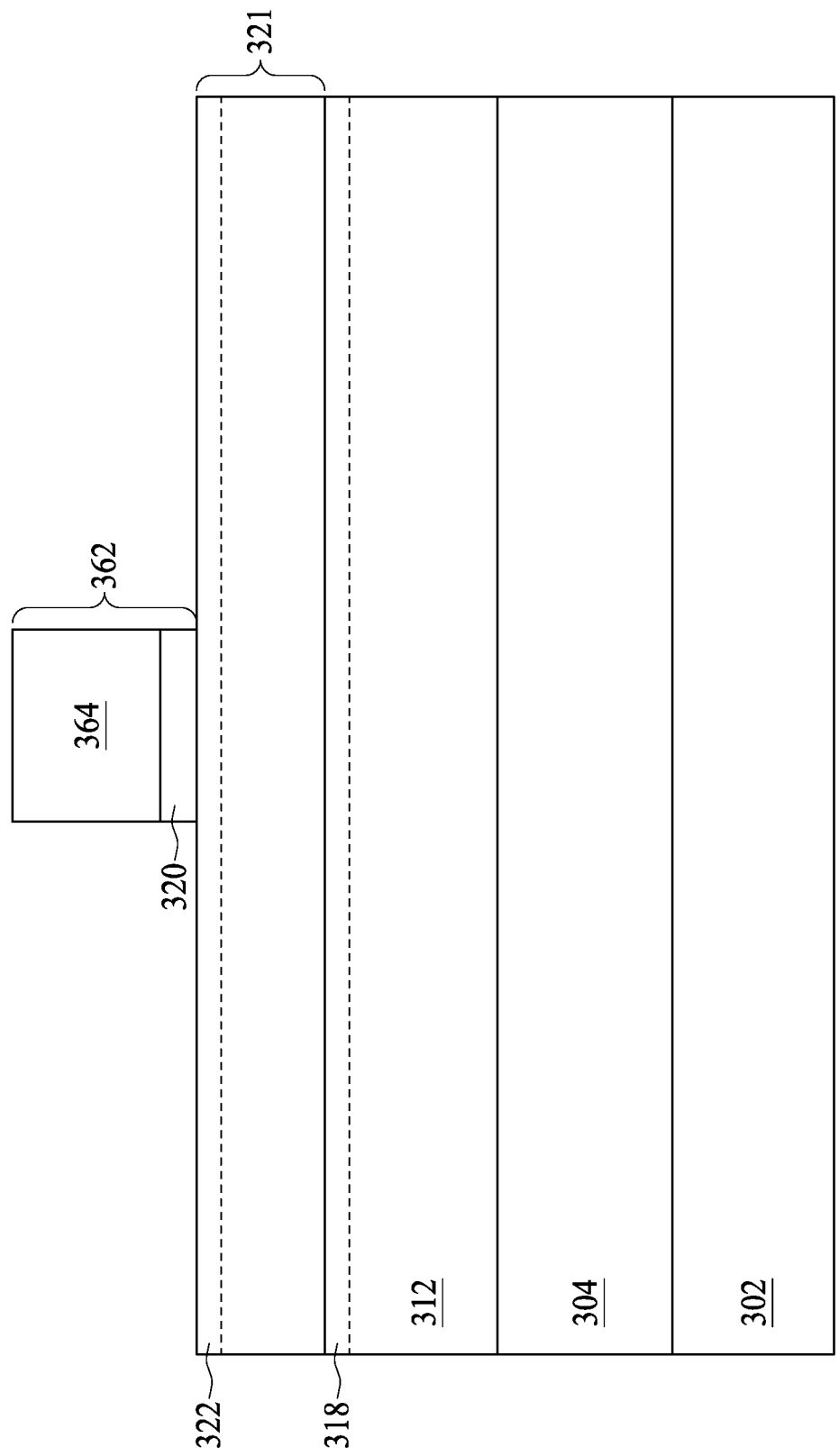
Figure 7B:
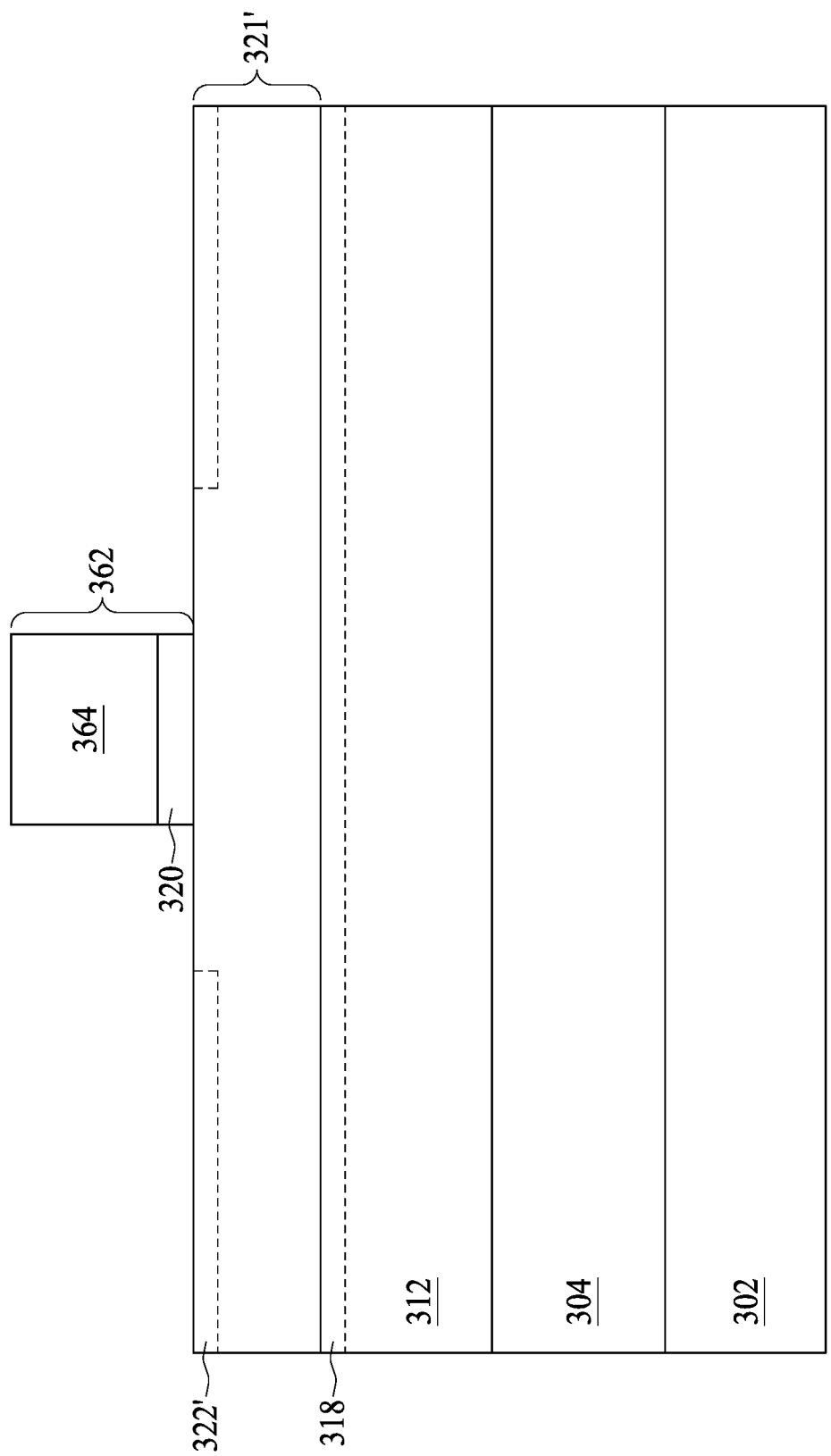

In substantially the same manner, as shown in FIG. 7(b), a gate structure 362 includes a conductive gate electrode 364 formed over a gate dielectric 320. The conductive gate electrode 364 may be comprised of any suitable conductive material, such as doped polysilicon, for example, or a metal such as titanium (Ti) or aluminum (Al). The gate dielectric 320 may be comprised of aluminum oxide (Al2O3), silicon dioxide (SiO2) or silicon nitride (Si3N4), for example. The gate electrode 364 forms a non-ohmic contact to the surface of the extra Al diffused active layer 321'.

Figure 8A:
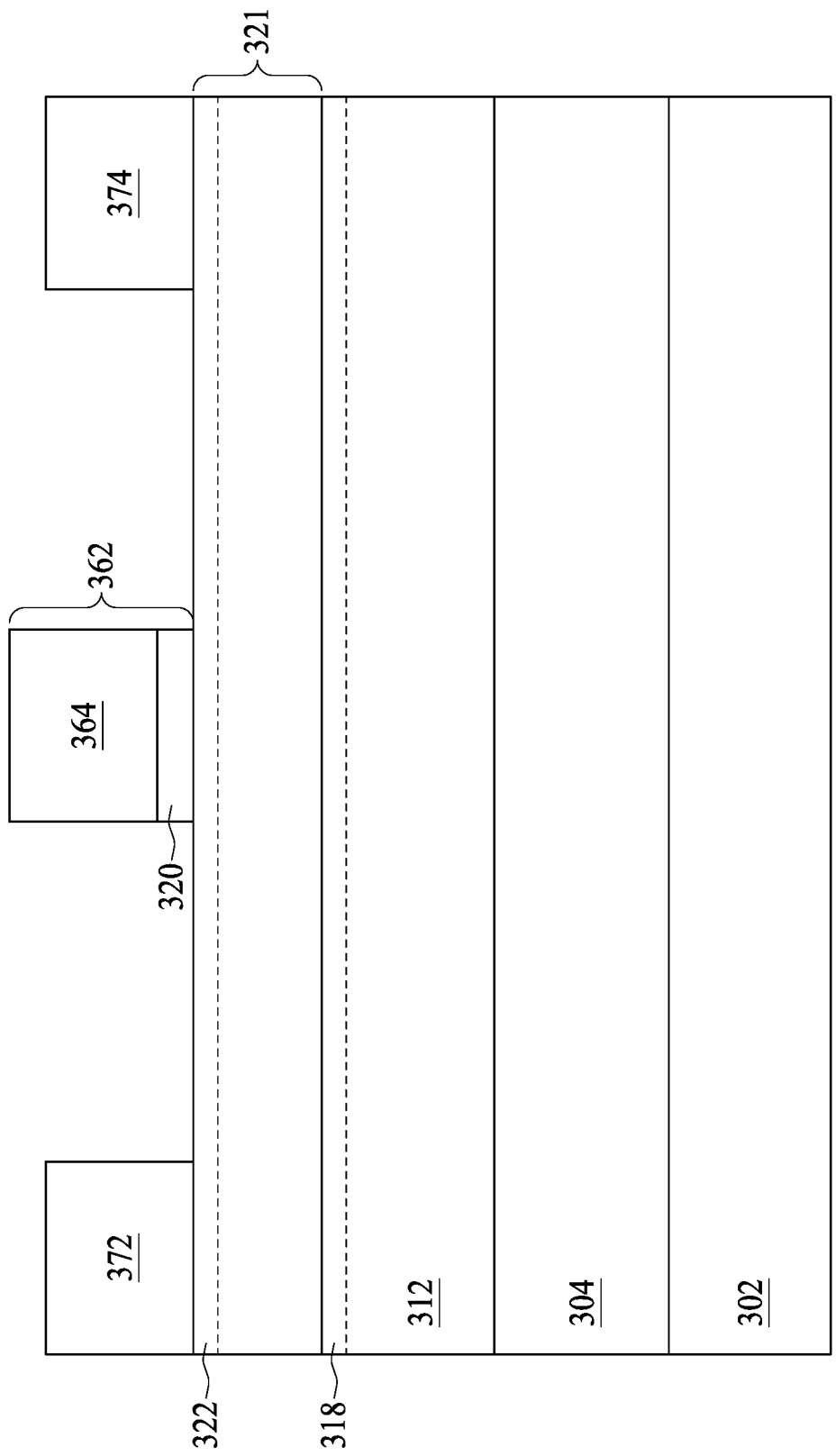
Figure 8B:
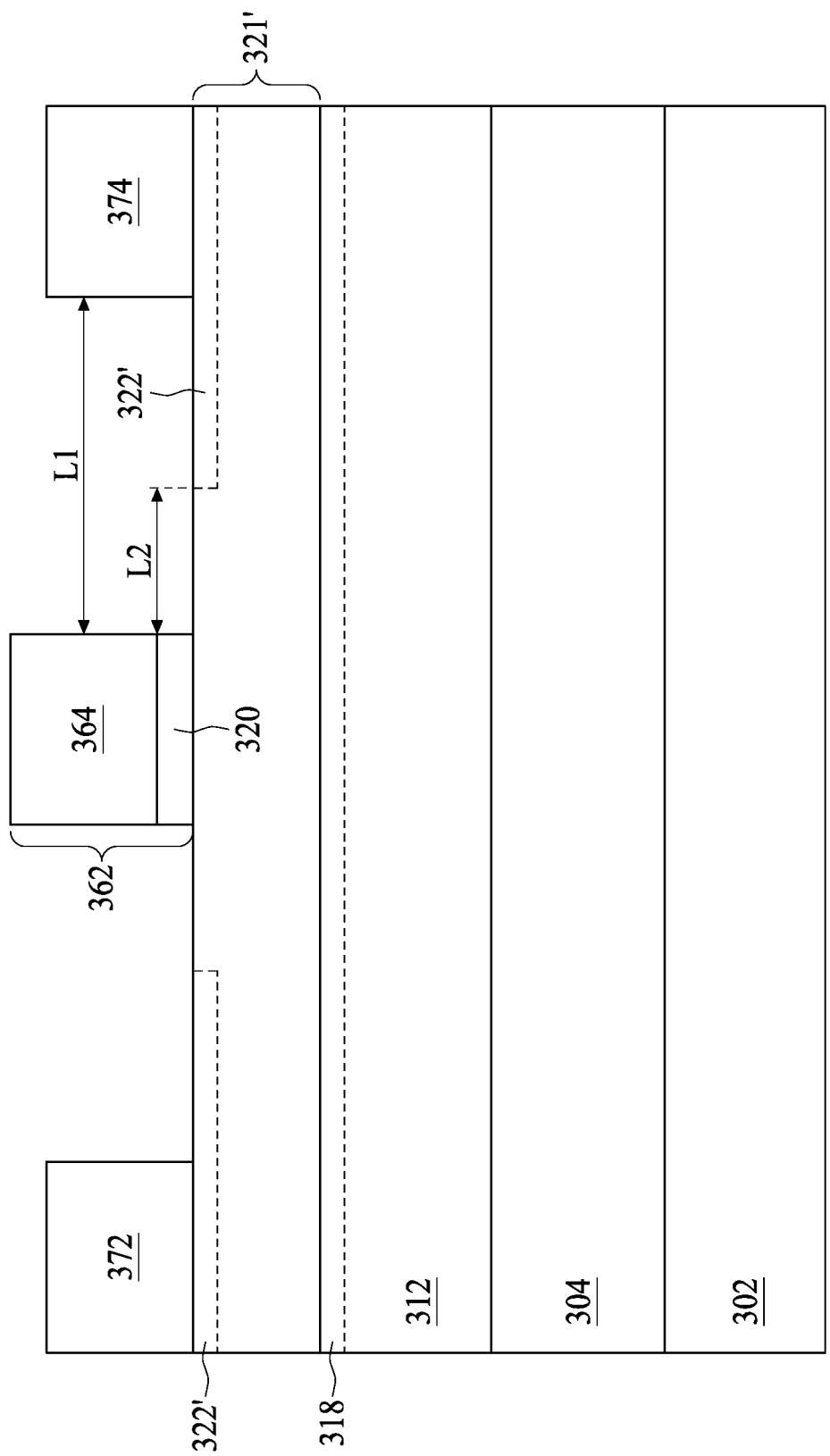

In FIG. 8(a), an ohmic source contact 372 and an ohmic drain contact 374 are provided on both sides of the gate electrode 364. The source and drain electrodes 372 and 374 are formed over and in contact with the surface of the high Al diffusion layer 322. In substantially the same manner, as shown in FIG. 8(b), an ohmic source contact 372 and an ohmic drain contact 374 are provided on both sides of the gate electrode 364. The source and drain electrodes 372 and 374 are formed over and in contact with the surface of the high Al diffusion layer 322'. In this embodiment, the gate electrode 364 is distanced from the drain electrode 374 by a distance L1 of about 20 um, and the gate electrode 364 is distanced from a nearest end of the high Al diffusion layer 322' at the side of the drain electrode 374 by a distance L2 of about 15 um. In some embodiments, a ratio of L2/L1 is from about 0 to about 0.8, and the distance L2 may denote the distance between the gate electrode 364 and the drain electrode 374 or the distance between the gate electrode 364 and the source electrode 372.

In general, electrons in the 2DEG 318 demonstrate high carrier mobility. The conductivity of this region is modulated by applying a voltage to the gate electrode 364. When a reverse voltage is applied, the conduction band in the vicinity of the 2DEG 318 is elevated above the Fermi level, and a portion of the 2DEG 318 is depleted of carriers, thereby preventing the flow of current from the source electrode 372 to the drain electrode 374.

Figure 10:
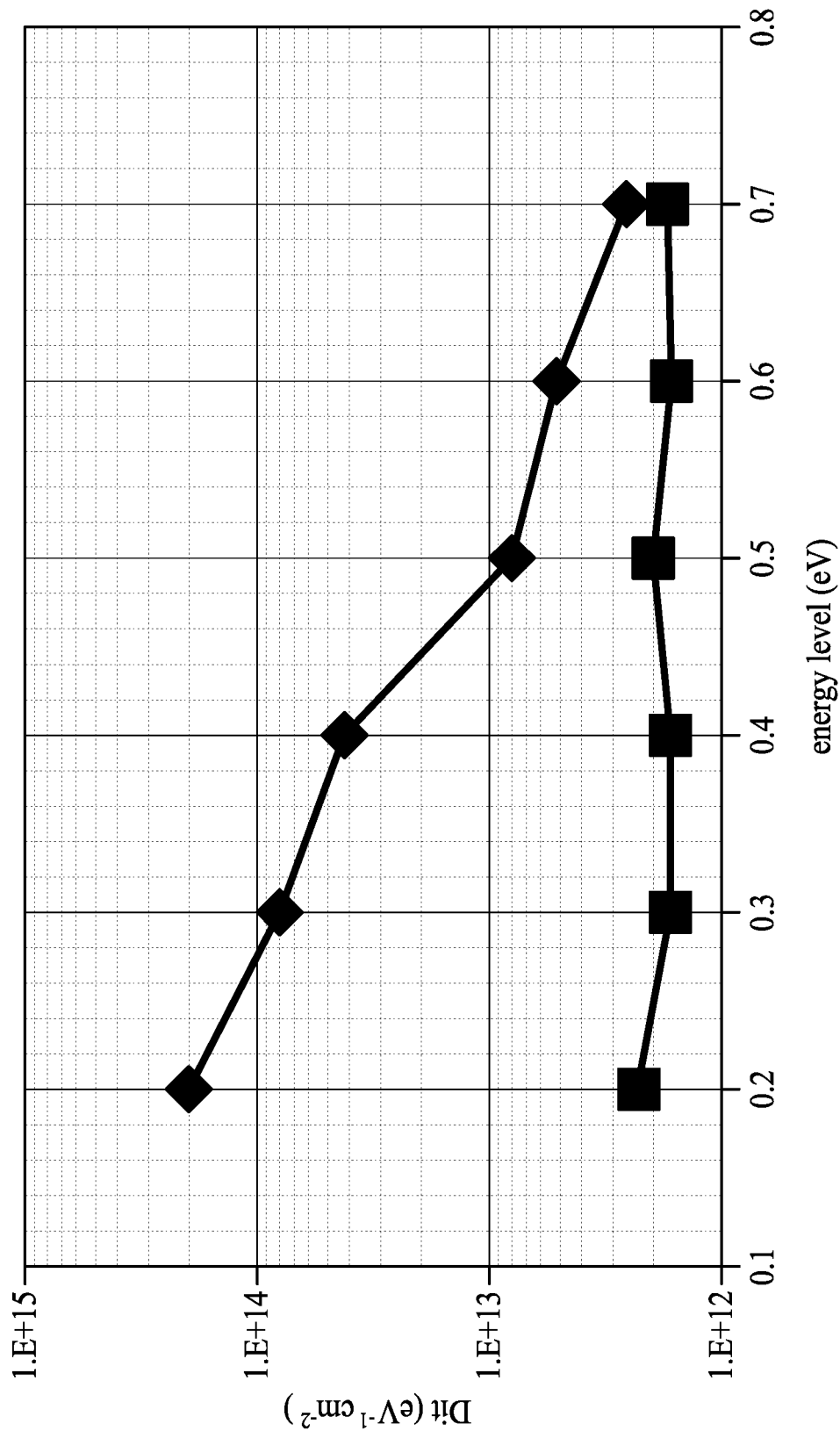
FIG. 10 is a graph illustrating results of experiments conducted by the inventors showing the value of the interface trap density Dit measured on the III-V HEMTs fabricated with and without the high Al diffusion layer at different depths in accordance with some embodiments of the present disclosure.

FIG. 10 is a graph illustrating results of experiments conducted by the inventors showing the value of the interface trap density Dit measured on the III-V HEMTs fabricated with and without the high Al diffusion layer 322/322' at different depths in accordance with some embodiments of the present disclosure. The different depths are corresponding to different energy levels labelled as "0.2", "0.3", "0.4", "0.5", "0.6" and "0.7" eV, respectively, that have been processed under the same conditions, except for the presence and absence of the high Al diffusion layer 322/322'. The smaller energy level corresponds to the shallower depth from the surface of the extra Al diffused active layer 321/321'. The III-V HEMTs fabricated without the high Al diffusion layer 322/322' (the data points in the form of "diamonds" as shown in FIG. 10) has a higher interface trap density Dit at those shallower depths compared to the III-V HEMTs fabricated with the high Al diffusion layer 322/322' (the data points in the form of "squares" as shown in FIG. 10).

Figure 11:
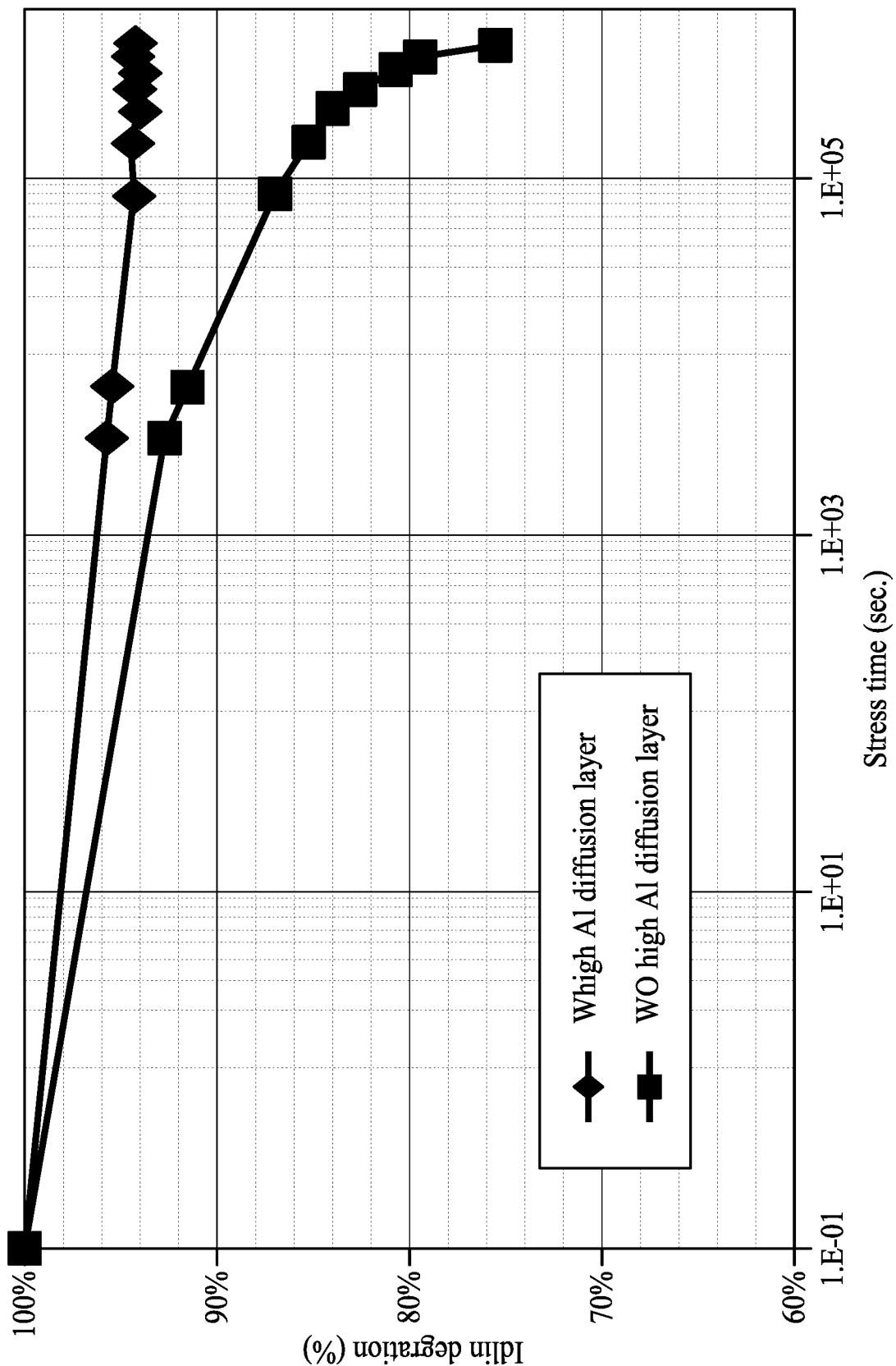
FIG. 11 is a graph illustrating results of experiments conducted by the inventors showing linear drain current (Idlin) degradation as functions of stress time measured on the III-V HEMTs fabricated with and without the high Al diffusion layer in accordance with some embodiments of the present disclosure.

FIG. 11 is a graph illustrating results of experiments conducted by the inventors showing linear drain current (Idlin) degradation as functions of stress time measured on groups of the III-V HEMTs fabricated with and without the high Al diffusion layer 322/322' in accordance with some embodiments of the present disclosure. It is found that the III-V HEMTs fabricated with the high Al diffusion layer 322/322' have less Idlin degradation than the III-V HEMTs fabricated without the high Al diffusion layer 322/322', i.e. the squares. The difference becomes more significant as the stress time prolongs. As such, it is appreciated that the III-V HEMTs, which possess the high Al diffusion layer 322/322', have a better performance at least in reliability.

Figure 12:
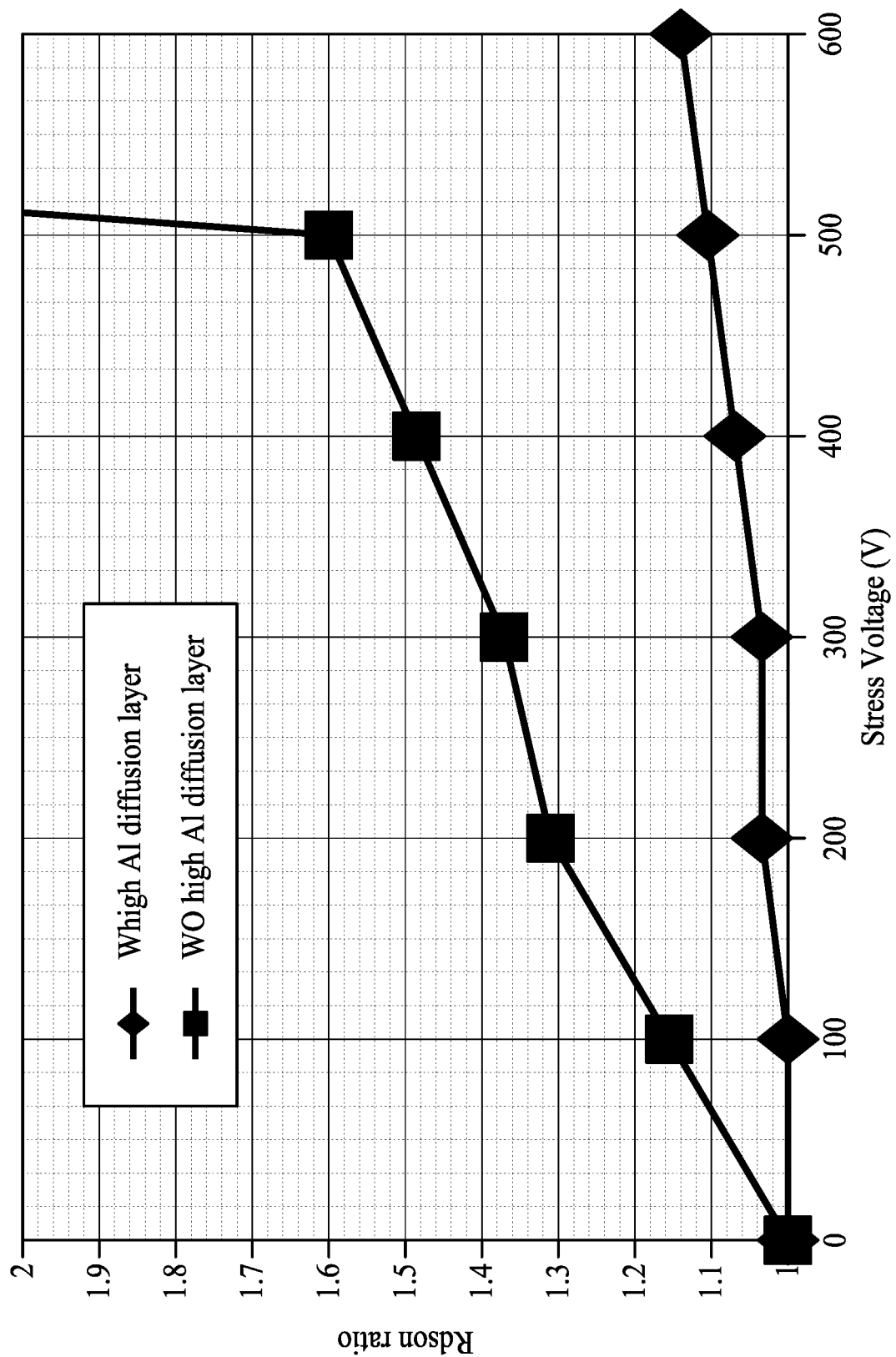
FIG. 12 is a graph illustrating results of experiments conducted by the inventors showing dynamic minimal "on" resistance (Rdson) ratio as functions of stress voltage measured on groups of the III-V HEMTs fabricated with and without the high Al diffusion layer in accordance with some embodiments of the present disclosure.

FIG. 12 is a graph illustrating results of experiments conducted by the inventors showing a dynamic minimal "on" resistance (Rdson) ratio as functions of stress voltage measured on groups of the III-V HEMTs fabricated with and without the high Al diffusion layer 322/322' in accordance with some embodiments of the present disclosure. It is found that the III-V HEMTs fabricated with the high Al diffusion layer 322/322' have less of an Rdson ratio increase than the III-V HEMTs fabricated without the high Al diffusion layer 322/322', i.e. the squares. In other words, the increasing speed of the Rdson of the HEMTs having the high Al diffusion layer 322/322' is lower than that of the HEMTs without the high Al diffusion layer 322/322'. The difference becomes more significant as the stress voltage increases. As such, it is appreciated that the III-V HEMTs, which possess the high Al diffusion layer 322/322', have a better performance at least in reliability.

Some embodiments of the present disclosure provide a semiconductor structure. The semiconductor structure includes: a channel layer; an active layer over the channel layer, wherein the active layer is configured to form a two-dimensional electron gas (2DEG) to be formed in the channel layer along an interface between the channel layer and the active layer; a gate electrode over a top surface of the active layer; and a source/drain electrode over the top surface of the active layer; wherein the active layer includes a first layer and a second layer sequentially disposed therein from the top surface to a bottom surface of the active layer, and the first layer possesses a higher aluminum (Al) atom concentration compared to the second layer.

Some embodiments of the present disclosure provide an HEMT structure. The HEMT structure includes: a channel layer; an extra aluminum (Al) diffused active layer over the channel layer, wherein the extra Al diffused active layer includes a high Al diffusion film with a thickness of about 1 nm to about 5 nm at a top of the extra Al diffused active layer; a gate electrode over a top surface of the extra Al diffused active layer; and a source/drain electrode over the top surface of the extra Al diffused active layer; wherein the high Al diffusion film possesses a higher Al atom concentration compared to a remaining portion of the extra Al diffused active layer beneath the high Al diffusion film.

Some embodiments of the present disclosure provide method for forming a semiconductor structure. The method includes: providing a channel layer having an active layer formed thereon; performing a surface treatment upon a top surface of the active layer; depositing an aluminum nitride (AlN) film over the top surface of the active layer; and performing an anneal upon the AlN.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a channel layer;
   an active layer over the channel layer, the active layer includes a first layer at the top surface and a second layer directly under the first layer at a bottom surface thereof, the first layer possessing a higher aluminum (Al) atom concentration compared to the second layer, and a ratio of a primary peak for Al atom concentration in the first layer to an Al atom concentration in the second layer is from about 1.1 to 2.5.

2. The semiconductor structure of claim 1, wherein the active layer includes a group III-V compound.

3. The semiconductor structure of claim 1, wherein the first layer has a thickness of about 1 nm to about 5 nm.

4. The semiconductor structure of claim 1, wherein a two-dimensional electron gas (2DEG) is formed in the channel layer along an interface between the channel layer and the active layer.

5. The semiconductor structure of claim 1, wherein the primary peak for Al atom concentration is located in the active layer and is distanced below the top surface of the active layer.

6. The semiconductor structure of claim 5, wherein the primary peak for Al atom concentration is located at the first layer.

7. The semiconductor structure of claim 1, wherein the first layer is blanket disposed at a top of the active layer.

8. The semiconductor structure of claim 1, further comprising a source/drain electrode and a gate electrode, wherein the source/drain electrode is laterally distanced from the gate electrode by a first lateral distance, the first layer is partially disposed at a top of the active layer and is kept from the gate electrode by a second lateral distance, wherein a ratio of the second distance to the first distance is from about 0 to about 0.8.

9. The semiconductor structure of claim 8, further comprising a gate dielectric between the gate electrode and the active layer.

10. A high electron mobility transistor (HEMT) structure, comprising:
    a channel layer; and
    an extra aluminum (Al) diffused active layer over the channel layer, wherein the extra Al diffused active layer includes a high Al diffusion film at a top surface of the extra Al diffused active layer, wherein the high Al diffusion film possesses a higher Al atom concentration compared to a remaining portion of the extra Al diffused active layer beneath the high Al diffusion film;
    a gate electrode over the top surface of the extra Al diffused active layer; and
    a source/drain electrode over the top surface of the extra Al diffused active layer, wherein the gate electrode is distanced from the source/drain electrode by a first distance, and the gate electrode is distanced from a nearest end of the high Al diffusion film at the side of the source/drain electrode by a second distance, and a ratio of the second distance/the first distance is from about 0 to about 0.8.

11. The HEMT structure of claim 10, further comprising a semiconductor substrate, wherein the channel layer is over the semiconductor substrate.

12. The HEMT structure of claim 11, further comprising a transition structure between the semiconductor substrate and the channel layer.

13. The HEMT structure of claim 10, further comprising a gate dielectric between the gate electrode and the active layer.

14. The HEMT structure of claim 10, wherein the channel layer includes gallium nitride (GaN).

15. The HEMT structure of claim 10, wherein the extra Al diffused active layer includes aluminum gallium nitride (AlGaN).

16. The HEMT structure of claim 10, wherein the high Al diffusion film includes AlGaN.

17. The HEMT structure of claim 10, wherein a ratio of a primary peak for Al atom concentration in the high Al diffusion film to an Al atom concentration in the extra Al diffused active layer is from about 1.1 to 2.5.

18. A high electron mobility transistor (HEMT) structure, comprising:
    a channel layer;
    a first extra aluminum (Al) diffused active layer over the channel layer; and
    a second extra Al diffused active layer over the first extra Al diffused active layer and overlapping a first portion of the first extra Al diffused active layer and free from overlapping a second portion of the first extra Al diffused active layer;
    wherein the second extra Al diffused active layer includes a higher aluminum (Al) atom concentration compared to the first extra Al diffused active layer.

19. The HEMT structure of claim 18, wherein the first extra Al diffused active layer and the second extra Al diffused active layer include aluminum gallium nitride (AlGaN).

20. The HEMT structure of claim 18, further comprising a gate dielectric between a gate electrode and the first extra Al diffused active layer, the gate dielectric being arranged to form a non-ohmic contact to an upper surface of the first extra Al diffused active layer.

* * * * *